(12) United States Patent
Nakase et al.

(10) Patent No.: US 10,403,605 B2
(45) Date of Patent: Sep. 3, 2019

(54) SEMICONDUCTOR DEVICE INCLUDING PLURAL SEMICONDUCTOR CHIPS

(71) Applicant: Buffalo Inc., Nagoya-shi (JP)

(72) Inventors: Yu Nakase, Nagoya (JP); Takayuki Okinaga, Nagoya (JP); Shuichiro Azuma, Nagoya (JP); Kazuki Makuni, Nagoya (JP); Takeshi Kotegawa, Nagoya (JP); Noriaki Sugahara, Nagoya (JP)

(73) Assignee: BUFFALO INC., Nagoya (JP)

( * ) Notice: Subject to any disclaimer, the term of this patent is extended or adjusted under 35 U.S.C. 154(b) by 0 days.

(21) Appl. No.: 15/850,975

(22) Filed: Dec. 21, 2017

(65) Prior Publication Data
US 2018/0182737 A1    Jun. 28, 2018

(30) Foreign Application Priority Data

Dec. 28, 2016 (JP) .................................. 2016-254800

(51) Int. Cl.
*H01L 25/065* (2006.01)
*H01L 23/00* (2006.01)
(Continued)

(52) U.S. Cl.
CPC ...... *H01L 25/0657* (2013.01); *H01L 23/5386* (2013.01); *H01L 24/06* (2013.01);
(Continued)

(58) Field of Classification Search
CPC ..... H01L 25/0657; H01L 24/06; H01L 24/49; H01L 23/522; H01L 23/538; H01L 23/5383; H01L 23/5386
See application file for complete search history.

(56) References Cited

U.S. PATENT DOCUMENTS 7,781,878 B2 * 8/2010 Chen ................. H01L 23/49575
257/676
7,939,927 B2 * 5/2011 Okada .................... H01L 25/18
257/686

(Continued)

FOREIGN PATENT DOCUMENTS

JP         U3148533      1/2009
JP         2010-245474   10/2010

(Continued)

*Primary Examiner* — William Coleman
(74) *Attorney, Agent, or Firm* — Xsensus LLP

(57) ABSTRACT

A semiconductor device comprising a plurality of semiconductor chips and a plurality of electric wirings. The plurality of semiconductor chips are stacked in a first direction, each semiconductor chip of the plurality of semiconductor chips including a plurality of conductive pads that are aligned in an aligning direction, orthogonal to the first direction. The plurality of semiconductor chips are stacked such that each semiconductor chip is shifted from an adjacent semiconductor chip of the plurality of semiconductor chips by a first predetermined interval in the aligning direction and shifted from the adjacent semiconductor chip by a second predetermined interval in a second direction orthogonal to both the first direction and the aligning direction. The plurality of electric wirings electrically connect the plurality of conductive pads of every other semiconductor chip of the plurality of semiconductor chips, respectively.

18 Claims, 10 Drawing Sheets

(51) Int. Cl.
*H01L 23/538* (2006.01)
*H01L 25/00* (2006.01)

(52) U.S. Cl.
CPC .......... *H01L 24/49* (2013.01); *H01L 25/0652* (2013.01); *H01L 25/50* (2013.01); H01L 24/05 (2013.01); H01L 24/48 (2013.01); H01L 2224/04042 (2013.01); H01L 2224/05554 (2013.01); H01L 2224/0612 (2013.01); H01L 2224/32145 (2013.01); H01L 2224/48091 (2013.01); H01L 2224/48145 (2013.01); H01L 2224/48147 (2013.01); H01L 2224/48227 (2013.01); H01L 2224/49175 (2013.01); H01L 2224/73265 (2013.01); H01L 2225/0651 (2013.01); H01L 2225/06506 (2013.01); H01L 2225/06562 (2013.01); H01L 2924/00014 (2013.01); H01L 2924/1436 (2013.01); H01L 2924/1438 (2013.01); H01L 2924/15162 (2013.01); H01L 2924/15311 (2013.01); H01L 2924/15323 (2013.01); H01L 2924/19041 (2013.01); H01L 2924/19105 (2013.01); H01L 2924/30107 (2013.01)

(56) References Cited

U.S. PATENT DOCUMENTS

| | | | | |
|---|---|---|---|---|
| 7,981,788 | B2 * | 7/2011 | Muto | H01L 24/48 |
| | | | | 438/617 |
| 9,224,682 | B2 * | 12/2015 | Nakayama | H01L 23/49838 |
| 9,853,015 | B1 * | 12/2017 | Fan | H01L 25/0657 |
| 9,859,263 | B2 * | 1/2018 | Kwon | H01L 25/18 |
| 10,002,851 | B2 * | 6/2018 | Lee | H01L 25/0657 |
| 2003/0137042 | A1 * | 7/2003 | Mess | H01L 23/3128 |
| | | | | 257/686 |
| 2004/0150084 | A1 * | 8/2004 | Nishida | H01L 24/49 |
| | | | | 257/678 |
| 2006/0091518 | A1 * | 5/2006 | Grafe | H01L 23/49838 |
| | | | | 257/686 |
| 2009/0273096 | A1 * | 11/2009 | Hiew | H01L 21/565 |
| | | | | 257/777 |
| 2010/0134740 | A1 * | 6/2010 | Nakao | G02F 1/136204 |
| | | | | 349/138 |
| 2010/0265751 | A1 | 10/2010 | Hong | |
| 2012/0119387 | A1 | 5/2012 | Katagiri et al. | |
| 2013/0037952 | A1 * | 2/2013 | Jung | H01L 25/0657 |
| | | | | 257/738 |
| 2013/0062784 | A1 | 3/2013 | Hong | |
| 2014/0103542 | A1 | 4/2014 | Katagiri et al. | |
| 2018/0323169 | A1 * | 11/2018 | Kelly | G11C 5/04 |

FOREIGN PATENT DOCUMENTS

| | | |
|---|---|---|
| JP | 2010-251762 | 11/2010 |
| JP | 2012-2054496 | 3/2012 |
| JP | 2012-104707 | 5/2012 |

* cited by examiner

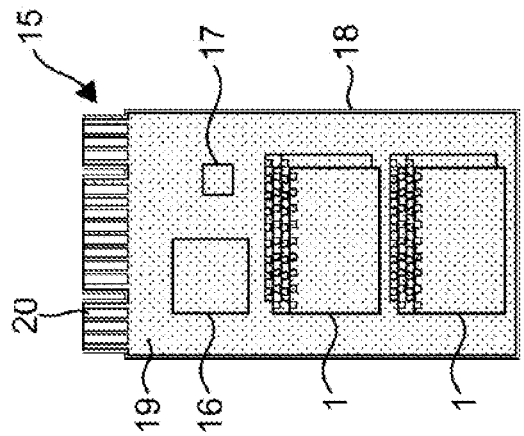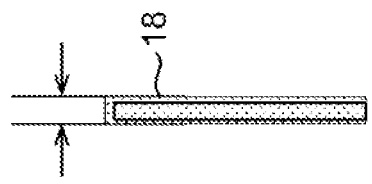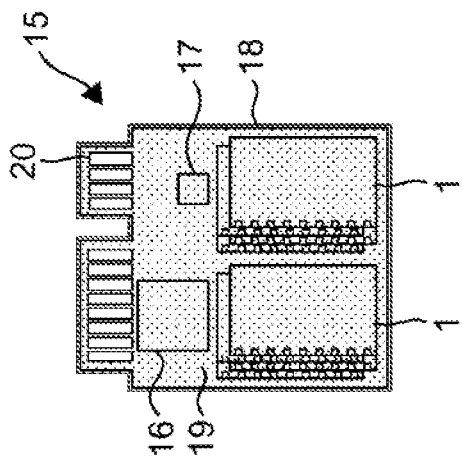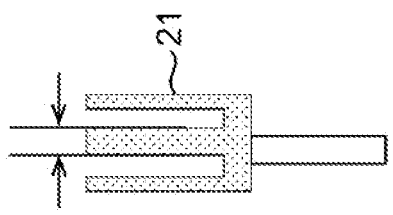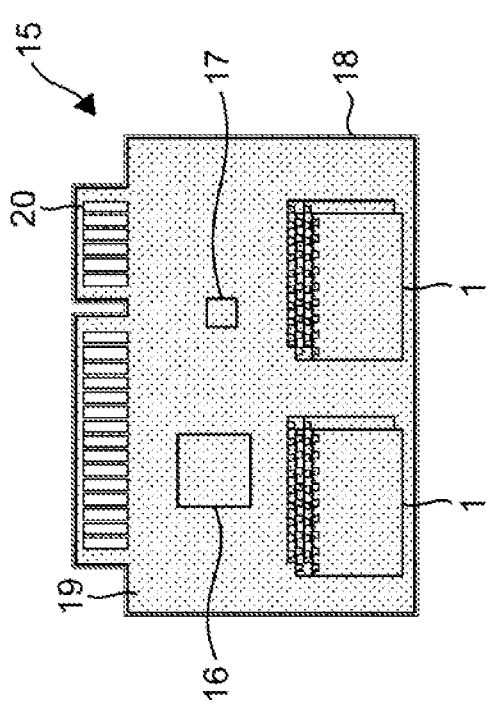

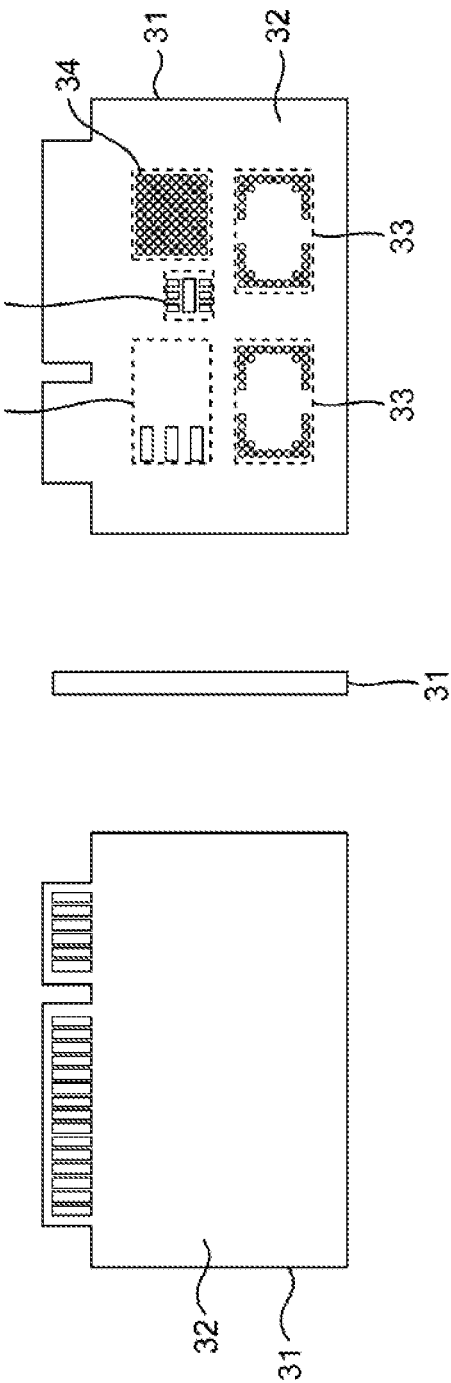

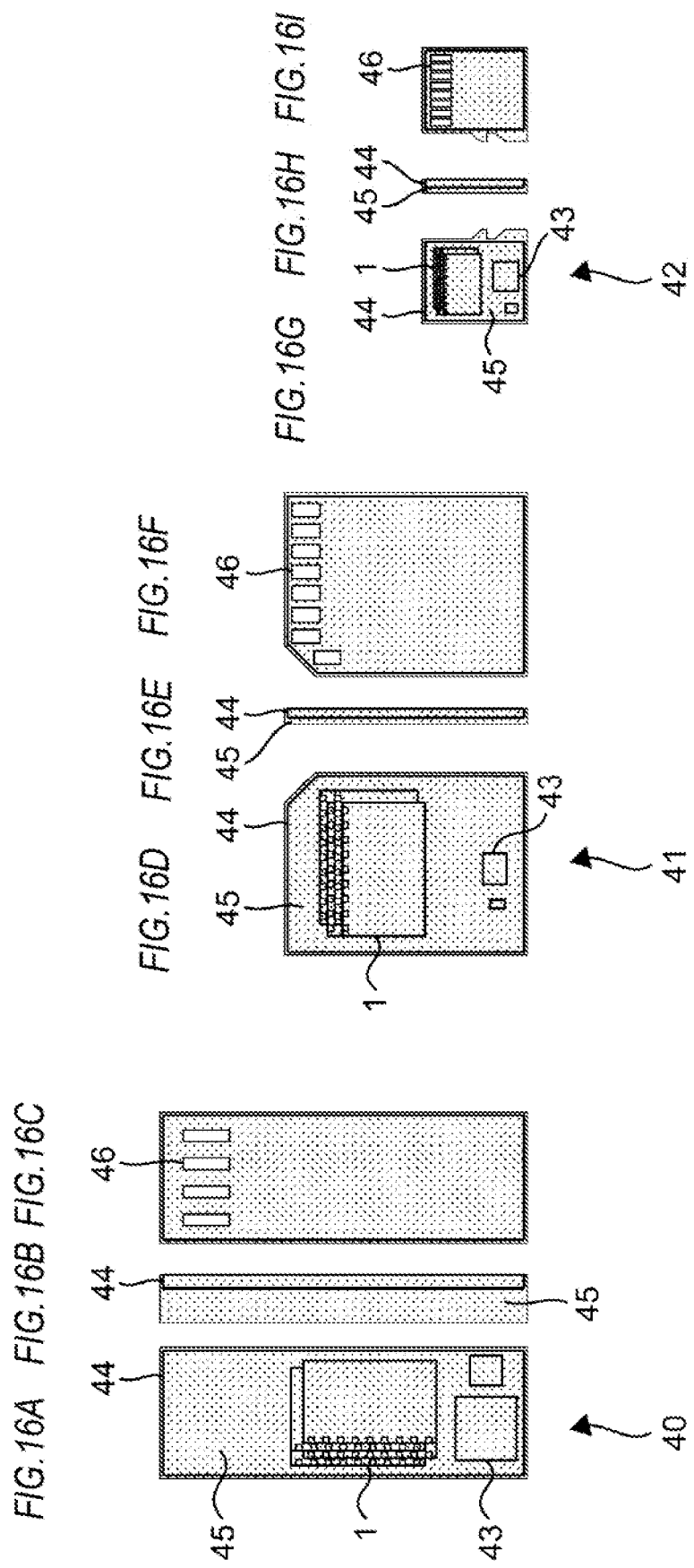

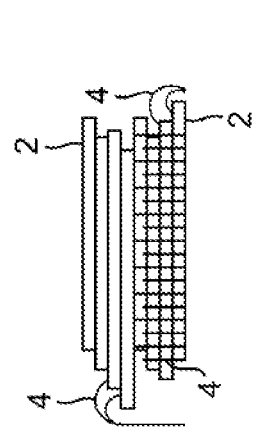
FIG.17A
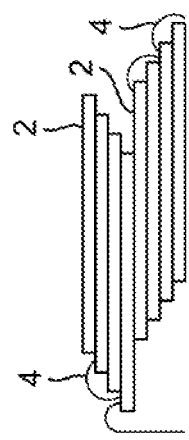
FIG.17B
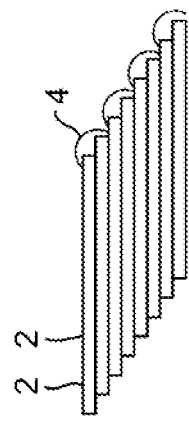
FIG.17C
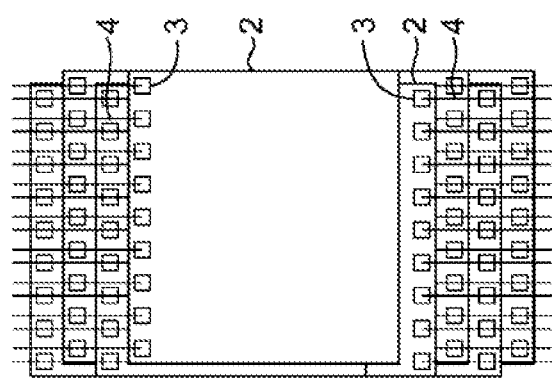
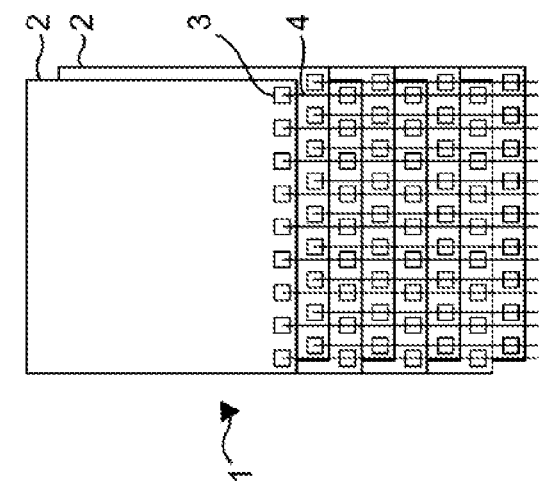

SEMICONDUCTOR DEVICE INCLUDING PLURAL SEMICONDUCTOR CHIPS

CROSS-REFERENCE TO RELATED APPLICATION

This application claims priority from Japanese Patent Application No. 2016-254800, filed on Dec. 28, 2016, the entire subject matter of which is incorporated herein by reference.

TECHNICAL FIELD

The present disclosure relates to a semiconductor device which includes a plurality of semiconductor chips in which a plurality of conductive pads are aligned.

BACKGROUND

A Solid State Drive (SSD) which includes a NAND type flash memory has been used in place of a Hard Disc Drive (HDD) as a memory device. As the size of the NAND type flash memory is reduced, the SSD has become larger in capacity and lower in price, so that it has been widely spread in faster speed.

On the other hand, as the capacity becomes larger and the a package becomes diverse, the types of the NAND type flash memory increase, and a distribution amount of each type of NAND type flash memory in the market decreases, so that the price of the NAND type flash memory tends to be higher.

Under such circumstances, a package called Multi Chip Package (MCP) formed by stacking NAND type flash memory chips in a thickness direction of the chips has been proposed in recent years. In the MCP, chips or a chip and a substrate on which the package is mounted are bonded by bonding wires (see, for example, JP-A-2012-104707 and JP-A-2010-251762).

In order to increase the operation speed of the entire MCP, a plurality of NAND type flash memories are divided for a plurality of channels and are operated in each channel ti increase data transfer bandwidth. Therefore, it is preferable to separate bonding wires for signal communication for each channel and bond them. In this case, since noises superimposed on the wires increase as the bonding wires become longer, it is desirable to shorten the bonding wires for signal communication as much as possible.

However, in the technical field related to the above-described conventional MCP, there has been no proposal in wires bonding which considers such a problem.

SUMMARY

An embodiment of the present disclosure provides a semiconductor device including a plurality of semiconductor chips and a plurality of electric wirings. Each of the semiconductor chips includes a plurality of semiconductor chips stacked in a first direction. Each semiconductor chip of the plurality of semiconductor chips includes a plurality of conductive pads that are aligned in an aligning direction that is orthogonal to the first direction, on at least one end portion thereof and spaced at a spacing along the aligning direction. The plurality of semiconductor chips are stacked such that each semiconductor chip is shifted from an adjacent semiconductor chip of the plurality of semiconductor chips by a first predetermined interval in the aligning direction and shifted from the adjacent semiconductor chip by a second predetermined interval in a second direction orthogonal to both the first direction and the aligning direction. The plurality of conductive pads of each semiconductor chip are spaced such that the conductive pads do not overlap conductive pads of the adjacent semiconductor chip of the plurality of semiconductor chips in the aligning direction. The plurality of electric wirings electrically connecting the plurality of conductive pads of every other semiconductor chip of the plurality of semiconductor chips, respectively. Each electric wiring of the plurality of electric wiring linearly extends in the second direction.

BRIEF DESCRIPTION OF DRAWINGS

The above and other aspects of the present disclosure will become more apparent and more readily appreciated from the following description of embodiments of the present disclosure taken in conjunction with the attached drawings, in which:

FIG. 14A to FIG. 14E show examples of an SSD device which includes a semiconductor device according to an embodiment;

FIG. 15A to FIG. 15C show another example of an SSD device which includes a semiconductor device according to an embodiment;

FIG. 16A to FIG. 16I show examples of a memory card which includes a semiconductor device according to an embodiment; and FIG. 17A to FIG. 17C show modifications of a semiconductor device according to an embodiment.

DETAILED DESCRIPTION

The present disclosure has been made in view of the above-described circumstances and provides a semiconductor device capable it reducing noise superimposed on an electric wiring for signal communication between a semiconductor chip and a substrate which configure a package.

Embodiment

Figure 1:
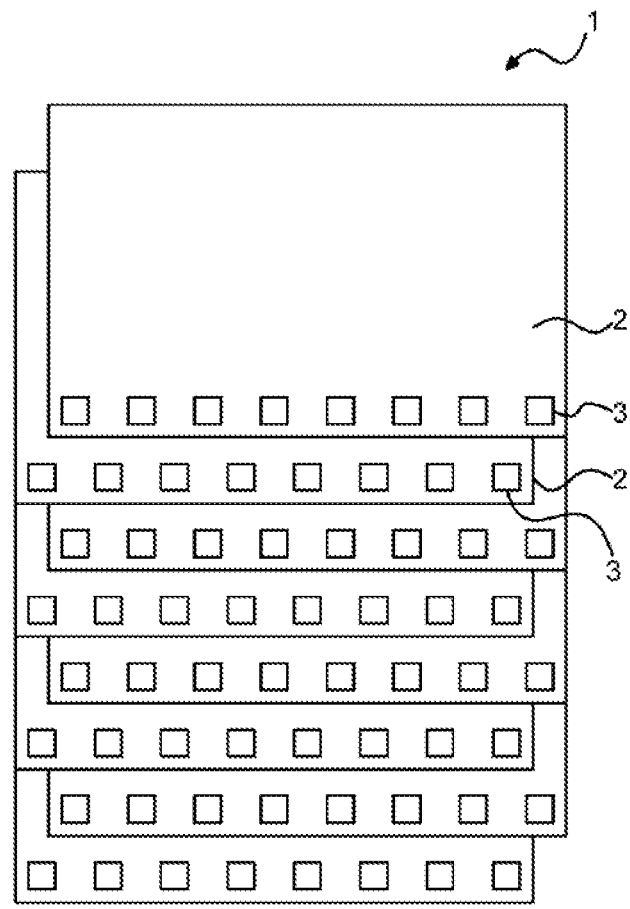
FIG. 1 is a plan view showing a schematic configuration of a semiconductor device according to an embodiment of the present disclosure.
Figure 2:
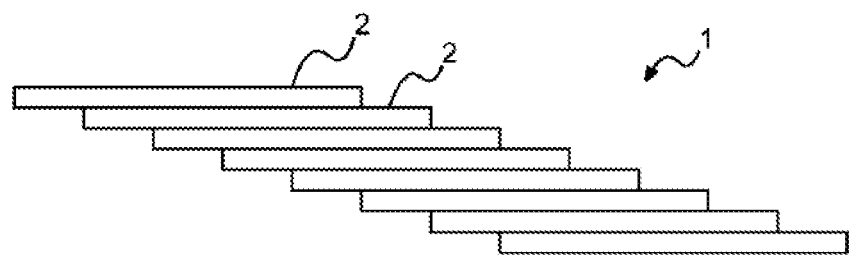
FIG. 2 is a side view showing a schematic configuration of the semiconductor device according to the embodiment.
Figure 3:
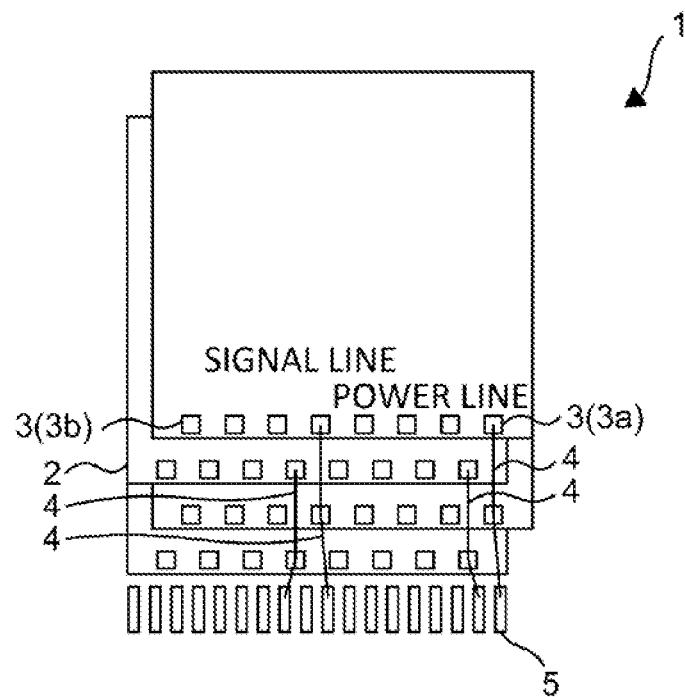
FIG. 3 is a plan view showing a schematic configuration of a wiring state of an electric wiring of the semiconductor device according to the embodiment.
Figure 4:
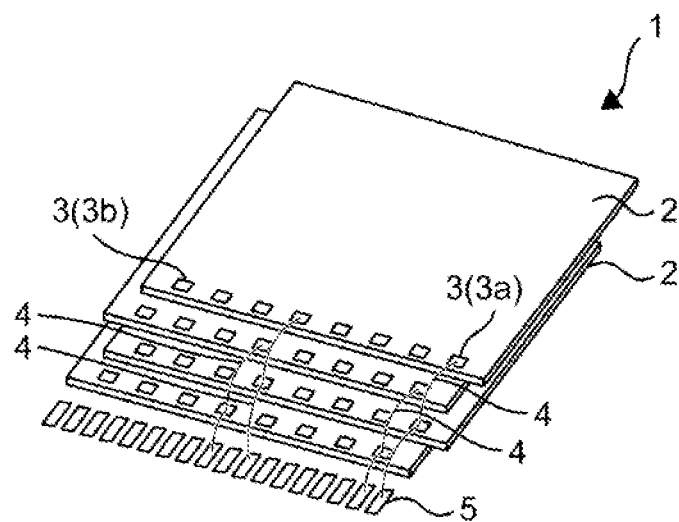
FIG. 4 is a perspective view showing the schematic configuration of the wiring state of the electric wiring of the semiconductor device according to the embodiment.
Figure 5:
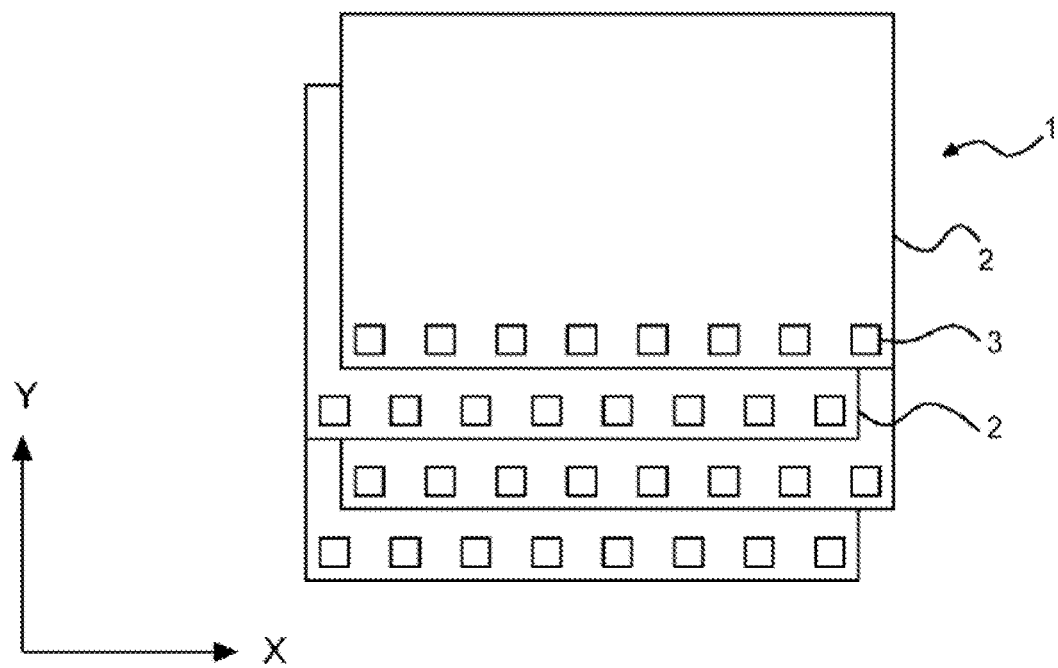
FIG. 5 is a view illustrating a positional relationship of conductive pads of the semiconductor device according to the embodiment.
Figure 6:
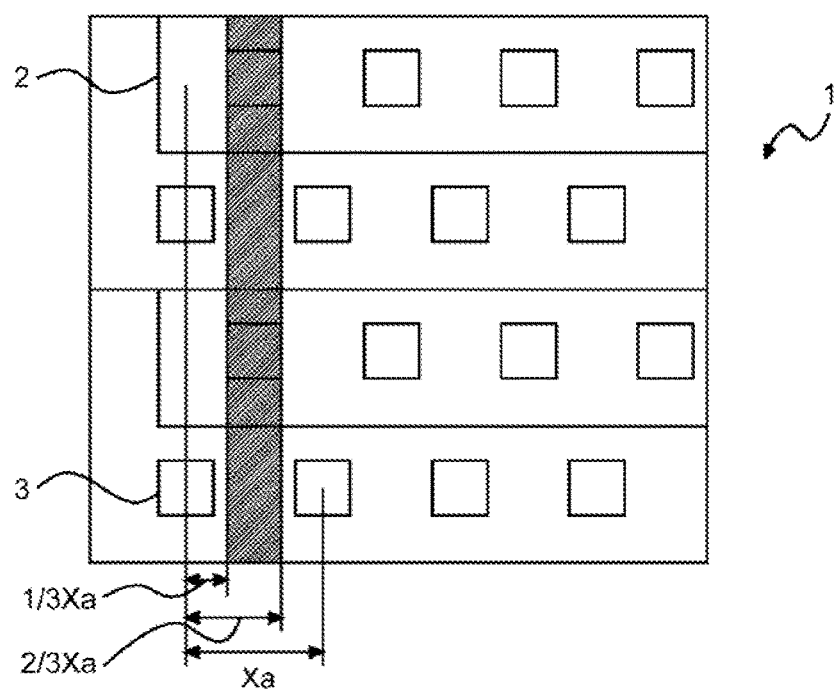
FIG. 6 is a view illustrating the positional relationship of the conductive pads of the semiconductor device according to the embodiment.

Hereinafter, a semiconductor device according to an embodiment will be described with reference to FIG. 1 to FIG. 7, FIG. 9 and FIG. 11. FIG. 1 is a plan view showing a schematic configuration of a semiconductor device according to an embodiment of the present disclosure. FIG. 2 is a side view. FIG. 3 is a plan view showing a schematic configuration of a wiring state of an electric wiring of the semiconductor device according to the embodiment. FIG. 4 is a side view. FIG. 5 and FIG. 6 are views illustrating a positional relationship of conductive pads of the semiconductor device according to the embodiment.

Specifically, a semiconductor device 1 according to an embodiment of the present disclosure is an NAND type flash memory (hereinafter, simply referred to as a flash memory). The flash memory 1 of the present embodiment includes NAND type flash memory chips (hereinafter, simply referred to as flash memory chips) 2 which are semiconductor chips, staked in a thickness direction of the flash memory 1.

As best shown in FIG. 1, the flash memory chips 2 have a rectangular plate shape when seen from a top of the semiconductor device, and a plurality of conductive pads 3 are arranged on one end portion thereof (the lower side end portion in FIG. 1) along a lower side of the flash memory chips 2 in FIG. 1. It is noted that, in FIG. 1, although the flash memory chip 2 has eight conductive pads 3, more conductive pads 3 can be aligned and only eight conductive pads 3 are shown for convenience of illustration.

The flash memory chips 2 are stacked in a vertical direction in FIG. 1 while being shifted one another in a horizontal direction in FIG. 2 by predetermined intervals. Accordingly, the flash memory chips 2 are stacked such that the conductive pads 3 aligned in the lower side end portion of the flash memory chips 2 are exposed to the outside.

Further, the flash memory chips 2 stacked vertically adjacent to each other in FIG. 1 are alternately shifted by predetermined intervals in the horizontal direction. Accordingly, the flash memory chips 2 are stacked such that the conductive pads 3 of a pair of the flash memory chips 2 stacked vertically adjacent to each other are located without overlapping with each other along an extension direction of the lower side in FIG. 1 which is an aligning direction of the conductive pads 3.

The conductive pads 3 of the flash memory chips 2 are electrically connected by a bonding wire 4 which is an electric wiring. A summary of a manner of connecting the conductive pads 3 of the flash memory chips 2 by the bonding wire 4 will be described with reference to FIG. 3 and FIG. 4.

As shown in FIG. 3 and FIG. 4, in the flash memory chip 2 of the present embodiment, a conductive pad 3a for power supply and a conductive pad 3b for signal communication are individually provided as the conductive pads 3. In FIG. 3 and FIG. 4, among the conductive pads 3 which are provided on the lower side end portion in FIG. 3 and aligned in the horizontal direction along the lower side, the conductive pad 3b for signal communication is provided on the left side and the conductive pad 3a for power supply provided on the right side. Detailed arrangement positions of the conductive pad 3a for power supply and the conductive pad 3b for signal communication will be described later.

The flash memory 1 shown in FIG. 3 and FIG. 4 includes four flash memory chips 2 and performs two channel operations. Since it is not necessary to perform the channel operations on the conductive pad 3a for power supply, the conductive pads 3a for power supply of all the flash memory chips 2 may be electrically connected by the bonding wires 4.

In the present embodiment, the flash memory chips 2 in FIG. 3 are stacked while being alternately shifted by predetermined intervals in the horizontal direction. Therefore, when seen from the top of the flash memory chips 2, a plurality of (two in the illustrated example) conductive pads 3a for power supply of every other one of the flash memory chips 2 are arranged in a row in a direction (specifically, in the vertical direction in FIG. 3) different from the horizontal direction in FIG. 3 which is the arrangement direction of the conductive pads 3a for power supply. Therefore, the plurality of conductive pads 3a for power supply of every other one of the flash memory chips 2 can be electrically connected by the bonding wires 4 linearly extending in the vertical direction in FIG. 3. As best shown in FIG. 3, the bonding wires 4 for electrically connecting the plurality of conductive pads 3a for power supply of every other one of the flash memory chips 2 extend at predetermined intervals from each other. Further, since the bonding wire 4 is connected to the conductive pad 5 provided on a substrate side (not shown), electric power is supplied to those flash memory chips 2.

On the other hand, for the conductive pads 3b for signal communication, it is necessary to electrically connect flash memory chips 2 to be operated in the same channel in units (in the illustrated example, since the four flash memory chips 2 are operated in two channels, they are operated in two units) by the bonding wires 4.

Here, in the present embodiment, the flash memory chips 2 to be operated in the same channel are selected as every other one of the plurality of (two in the embodiment) flash memory chips 2. With this selection, since the flash memory chips are stacked while being alternately shifted by predetermined intervals in the horizontal direction in FIG. 3, the conductive pads 3b for signal communication of the flash memory chip 2 to be operated in the same channel are arranged in a row in a direction (specifically, in the vertical direction in FIG. 3) different from the horizontal direction in FIG. 3 which is the Aligning direction of the conductive pads 3a for power supply. Therefore, the plurality of (two in the embodiment) conductive pads 3b for signal communication of every other one of the flash memory chips 2 for operation in the same channel can be electrically connected by the bonding wires 4 linearly extending in the vertical direction in FIG. 3. Further, the bonding wires 4 are connected to the conductive pads 5 provided on the substrate side (not shown), and therefore, signals can be sent and received between those flash memory chips 2 and the substrate.

A manner of connecting the conductive pads 3 of the flash memory chips 2 the bonding wires 4 will be described in detail with reference to FIG. 7 and FIG. 9.

Figure 7:
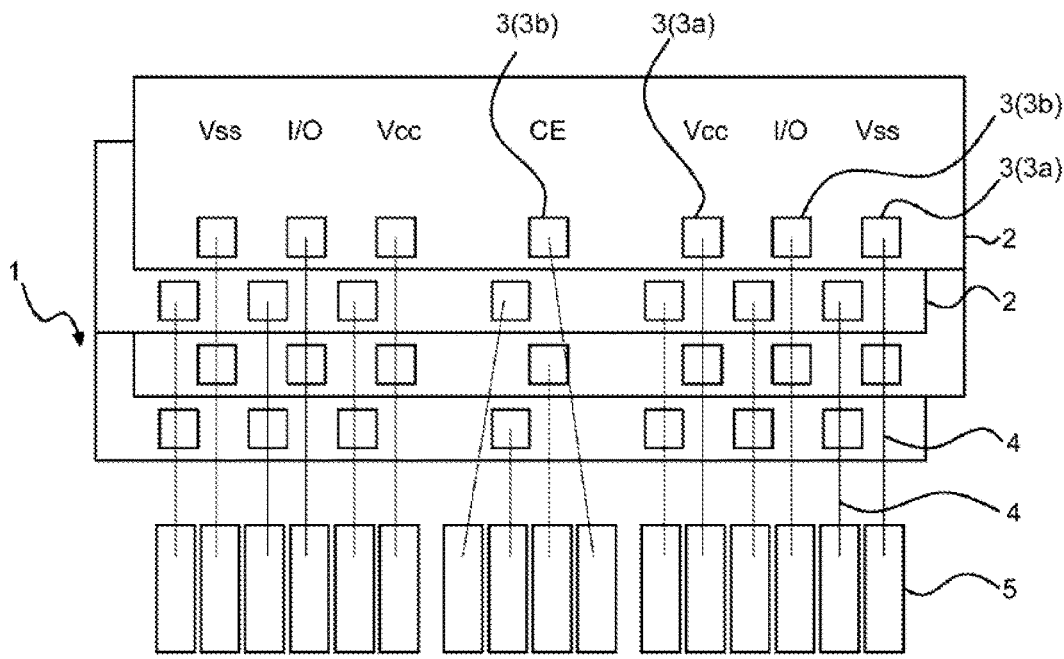
FIG. 7 is a plan view illustrating a positional relationship between the conductive pad and the electric wiring of the semiconductor device according to the embodiment.

In the flash memory chip 2 of the present embodiment, as best shown in FIG. 7, an input/output (I/O) conductive pad 3b for signal communication serving as the conductive pad 3b for signal communication is interposed between a Vcc (power supply of 5 V or the like) conductive pad 3a for power supply serving as the conductive pad 3a for power supply and a Vss (ground voltage) conductive pad 3a for power supply serving as the conductive pad 3a for power supply in the horizontal direction which is the aligning direction of the conductive pads 3. A Chip Enable (CE) conductive pad 3b for signal communication is arranged between the pairs of the Vcc conductive pads 3a for power supply, the I/O conductive pads 3b for signal communication and the Vss conductive pads 3a for power supply.

As described above, the Vcc conductive pads 3a for power supply and the Vss conductive pads 3a for power supply of every other one of the flash memory chips 2 are electrically connected by the bonding wires 4 linearly extending in the vertical direction in FIG. 7. The plurality of (two in the embodiment) I/O conductive pads 3b for signal communication of every other one of the flash memory chips 2 to be operated in the same channel are also electrically connected by the bonding wires 4 linearly extending in the vertical direction in FIG. 7. As best shown in FIG. 7, the bonding wire 4 for electrically connecting the I/O conductive pads 3b for signal communication is interposed between the bonding wire electrically connecting the Vcc conductive pad 3a for power supply and the bonding wire 4 for electrically connecting the Vss conductive pad 3a for power supply. On the other hand, since the CE conductive pad 3b for signal communication needs to be connected to the substrate (not shown) for each flash memory chip 2, each of the CE conductive pads 3b for signal communication of each flash memory chip 2 is electrically connected to a conductive pad 5 provided on the substrate side (not shown).

Figure 8:
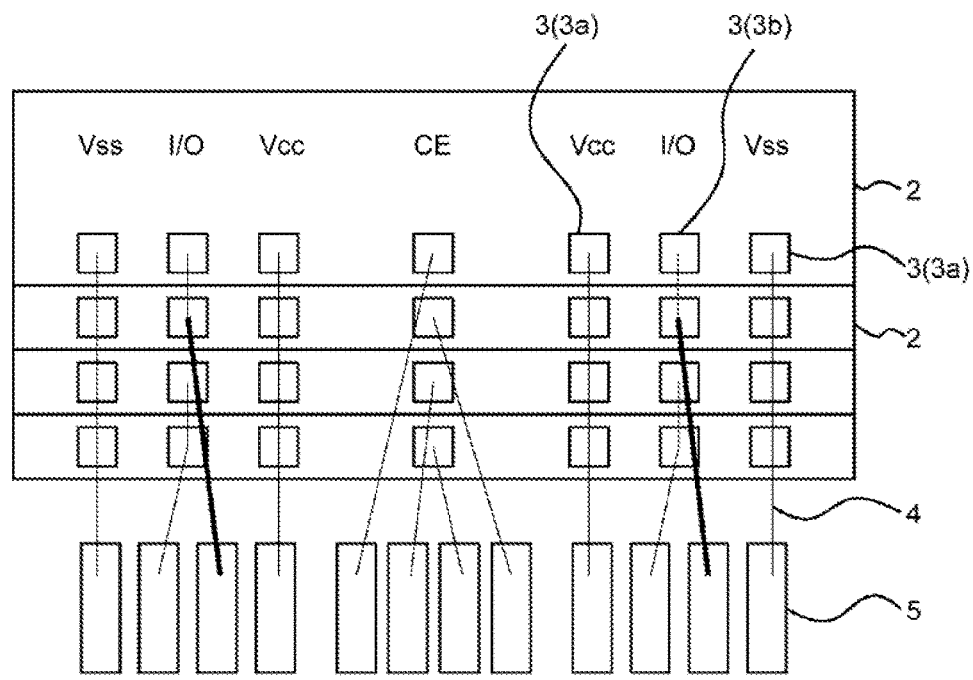
FIG. 8 is a plan view illustrating a positional relationship a conductive pad and an electric wiring of a semiconductor device according to a comparative example.
Figure 10:
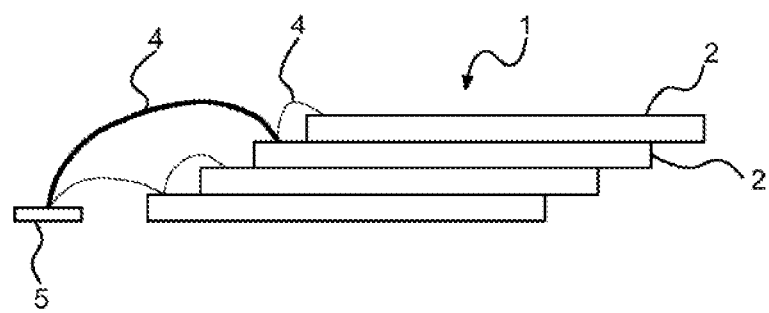
FIG. 10 is a side view illustrating the positional relationship between the conductive pad and the electric wiring of the semiconductor device according to the comparative example.

Here, referring to FIG. 8 and FIG. 10, comparison is made with a case where the flash memory chips are stacked without being shifted in the horizontal direction of FIG. 8. The flash memory chips 2 to be operated in the same channel are regarded as two flash memory chips 2 vertically adjacent to each other. In this case, since there is a possibility of short-circuiting if each bonding wire 4 overlaps, the bonding wire 4 (indicated by a thick line in the drawing) which electrically connects the I/O conductive pad 3b for signal communication of the flash memory chip 2 for the channel located on the upper side to the conductive pad 5 on the substrate side in FIG. 8 is necessary to be wired so as to avoid the bonding wire 4 which electrically connects the I/O conductive pad 3b for signal communication of the flash memory chip 2 for the channel located on the lower side to the conductive pad 5 on the substrate side in FIG. 8. Therefore, the wiring length necessarily becomes longer.

Figure 9:
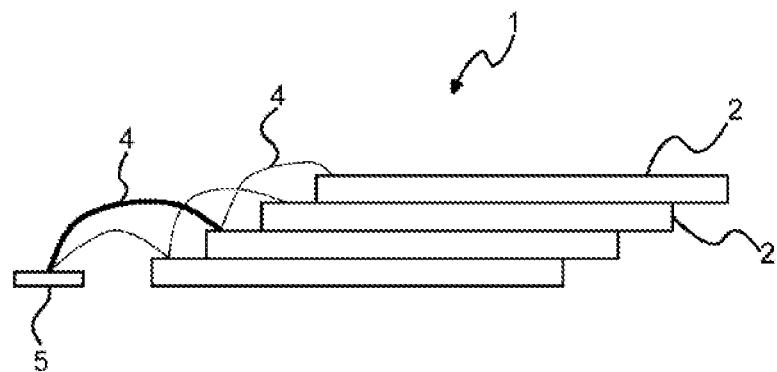
FIG. 9 is a side view illustrating the positional relationship between the conductive pad and the electric wiring of the semiconductor device according to the embodiment.
Figure 11:
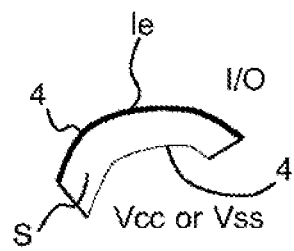
FIG. 11 is a view illustrating wiring noise of the semiconductor device according to the embodiment.

In FIG. 9 and FIG. 11, only the bonding wire 4 connecting the I/O conductive pad 3b for signal communication to the conductive pad 5 is shown in order to clarify the operation of this embodiment.

Here, the voltage fluctuation, which becomes noise, is referred to as ΔV, an effective inductance of the bonding wire 4 connecting the I/O conductive pad 3b for signal communication to the conductive pad 5 is referred to as $L_{eff}$, and the current flowing to the bonding wire 4 is referred to as i. Then, a relationship between di/dt which is a time rate of change of the current i and the voltage fluctuation ΔV is expressed by Equation 1.

[Equation 1]

$$\Delta V = L_{eff} \times \frac{di}{dt} \quad (1)$$

Additionally, when a self-inductance of the bonding wire 4 connecting the I/O conductive pad 3b for signal communication to the conductive pad 5 is referred to as $L_S$, and a mutual inductance is referred to as $L_M$, Equation 2 is established.

[Equation 2]

$$L_{eff} = L_S - L_M \quad (2)$$

Figure 12:
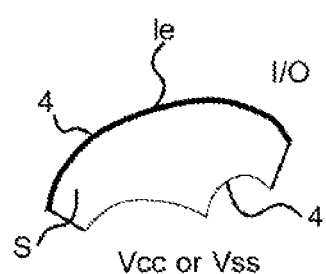
FIG. 12 is a view illustrating wiring noise of the semiconductor device according to the comparative example.

As shown in FIG. 12, if the length of the bonding wire 4 connecting the I/O conductive pad 3b for signal communication to the conductive pad 5 is referred to as le, and a loop area which is formed by the bonding wire 4 connecting adjacent Vss conductive pad 3a for power supply or Vcc conductive pad 3a for power supply is referred to as S, Equation 3 is established.

[Equation 3]

$$L_S \propto le \quad (3)$$

$$L_M \propto \frac{1}{S} \quad (4)$$

As the bonding wire 4 connecting the I/O conductive pad 3b for signal communication to the conductive pad 5 becomes longer, $L_S$ increases and $L_M$ decreases. Therefore, $L_{eff}$ increases, and noise ΔV increases.

On the other hand, as best shown in FIG. 7, in the flash memory 1 of the present embodiment, the bonding wire 4 connecting the I/O conductive pad 3b for signal communication to the conductive pad 5 linearly extends in the vertical direction. Additionally, the bonding wires 4 of different channels are in positions which are not overlapped with each other. Therefore, as shown in FIG. 11, le in the above Equation can be shortened and the noise ΔV can be reduced.

Here, the condition of the arrangement positions of the flash memory chips 2 will be described with reference to FIG. 5 and FIG. 6. As shown in FIG. 5, the four flash memory chips 2 vertically adjacent to each other are stacked while being alternately shifted by predetermined intervals in the horizontal direction. Additionally, as shown in FIG. 5, the X axis is taken in the horizontal direction and the Y axis is taken in the vertical direction of the flash memory chip 2.

At this time, as shown in FIG. 6, in one flash memory chip 2, for example, the flash memory chip 2 positioned at the lowest position in FIG. 6, when the distance in the X axis direction between centers of the adjacent conductive pads 3 in the aligning direction of the conductive pads 3 that is, the X axis direction) is Xa, it is preferable that the center position of the conductive pad 3 of the flash memory chip 2 positioned thereabove is in a range of ⅓ Xa to ⅔ Xa (a range shown by hatchings in FIG. 6) from the center position of the conductive pad 3 of the lowest flash memory chip 2.

Effect of Embodiment

As described above, in the flash memory 1 of the present embodiment, since the wiring length of the bonding wire 4 can be shortened, the voltage fluctuation (ΔV in the above equation) in the bonding wire 4 can be suppressed. Therefore, according to the present embodiment, there is provided the semiconductor device capable of reducing noise superimposed on the electric wiring for signal communication between the semiconductor chip and the substrate which configure the package.

Application Examples

Next, application examples of the flash memory 1 of the present embodiment will be described with reference to FIG. 13A to FIG. 16I.

Figure 13A:
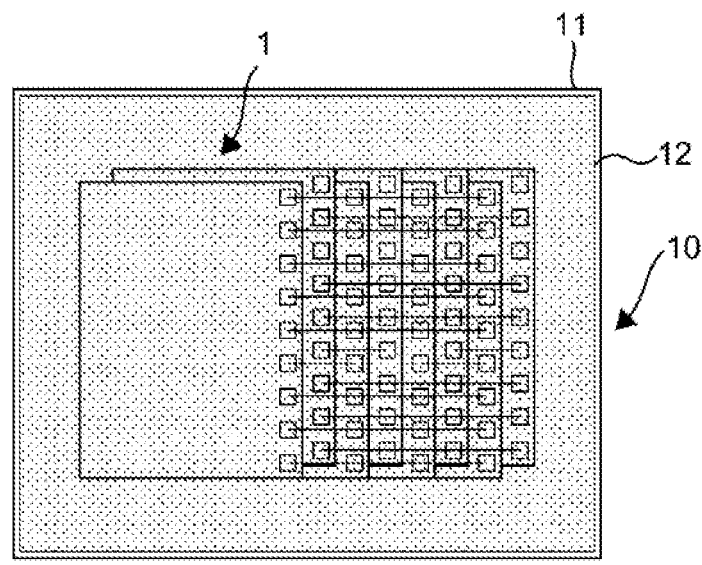
FIG. 13A to FIG. 13C show a NAND type flash memory in which a semiconductor device according to an embodiment is packaged.
Figure 13B:
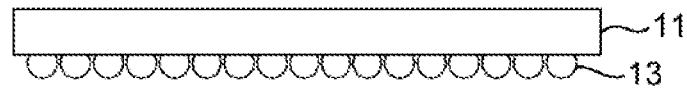
Figure 13C:
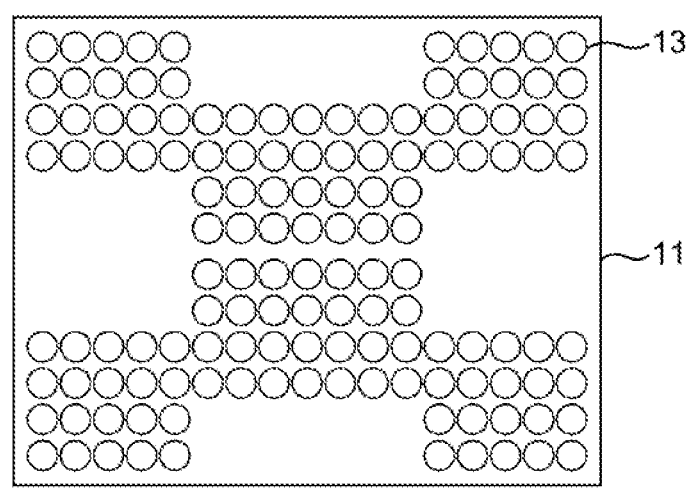

FIG. 13A to FIG. 13C show a package which includes the flash memory 1 of the present embodiment. FIG. 13A is a plan view, FIG. 13B is a side view, and FIG. 13C is a bottom view. The package 10 shown in FIG. 13A to FIG. 13 C is a so-called Ball Grid Array (BGA). In the package 10, the flash memory 1 and the ripper part of the substrate 11 on which the flash memory 1 of this embodiment is mounted are molded by the molding material 12, and substantially spherical or substantially hemispherical bumps (solder balls) 13 are provided on the back surface of the substrate 11. Accordingly, the NAND type flash memory package 10 of a large capacity can be provided.

FIG. 14A to FIG. 14E show SSD devices which includes the flash memory 1 of the present embodiment; FIG. 14A shows an SSD device using a half slim SATA (Serial ATA) size substrate, FIG. 14B shows an SSD device using a mini SATA (mSATA) standard connector and an mSATA mini standard substrate, FIG. 14C shows an SSD device using an m.2 SATA standard connector and a substrate, FIG. 14D is an enlarged side view showing the connector portion of the SSD device shown in FIG. 14A, and FIG. 14E is an enlarged side view showing the end portion of the substrate of the SSD device shown in FIG. 14A.

In the SSD device 15 shown in FIG. 14A to FIG. 14E, a plurality of flash memories 1 of the present embodiment are mounted on the upper surface, the upper portion of the substrate 18 on which a controller 16 and a regulator 17 are mounted and these flash memories 1 are molded by the molding material 19, and the contact portion 20 conforming to the SATA standard is formed on an end portion of the substrate 18. Accordingly, the SSD device 15 of System On Chip can be provided.

In the SSD device 15 of the half slim SATA size shown in FIG. 14A, as shown in FIG. 14D and FIG. 14E, it is preferable that the thickness of the substrate 18 is set to be equal to the thickness of the contact portion of the connector 21 (1.2 mm by standard).

FIG. 15A to FIG. 15C show a half slim SATA size substrate as shown in FIG. 14A. FIG. 15A is a plan view, FIG. 15B is a side view, and FIG. 15C is a bottom view. In FIG. 15A to FIG. 15C, the upper surface and the lower surface of the substrate 31 are molded by a molding material 32, and on the back surface, expansion pads 33 to 36 are formed in which the flash memory 1, a Dynamic RAM (DRAM), a regulator and a double electric layer capacitor such as a super capacitor (registered trademark) can be mounted. Therefore, an SSD device similar to the SSD device 15 shown in FIG. 14A to FIG. 14C can be configured by mounting the flash memory 1 or the like through the expansion pads 33 to 36.

FIG. 16A to 16I show memory cards which includes the flash memory 1 of this embodiment. FIG. 16A is a plan view of a Universal Serial Bus (USB) flash memory, FIG. 16B is a side view thereof, and FIG. 16C is a bottom view thereof. FIG. 16D is a plan view of a SD card, FIG. 16E is a side view thereof, and FIG. 16F is a bottom view thereof. FIG. 16G is a plan view of a micro SD card, FIG. 16H is a side view thereof, and FIG. 16I is a bottom view thereof.

The flash memory 1 and the controller 43 of this embodiment are mounted on the upper surfaces of the USB flash memory 40, the SD card 41 and the micro SD card shown in FIG. 16A to FIG. 16I, the upper part of the substrate 44 having a shape according to the standard of each memory card and these flash memories 1 or the like are molded by the molding material 45, and the contact portion 46 conforming to each standard is formed on one end portion of the substrate 44.

Modification

It is to be noted that the semiconductor device of the present disclosure is not limited to the above embodiment, and various modifications can be carried out.

As one example, as shown in FIG. 1 and FIG. 17A, in the flash memory 1 of an embodiment, the flash memory chips 2 are stacked while being shifted in one direction (vertical direction in FIG. 17A) at predetermined intervals. However, the stack configuration is not limited to that in FIG. 17A, and as an example, as shown in FIG. 17B, the flash memory chips 2 may be stacked while being shifted in both up and down directions (that is, in two directions). Further, as shown in FIG. 17C, in addition to the vertical direction, the flash memory chips 2 may be stacked while being shifted also in the horizontal direction, that is, in four directions.

The invention claimed is:

1. A semiconductor device, comprising:
a plurality of semiconductor chips stacked in a first direction, each semiconductor chip of the plurality of semiconductor chips including a plurality of conductive pads that are aligned in an aligning direction, orthogonal to the first direction, on at least one end portion thereof and spaced at a spacing along the aligning direction, wherein
the plurality of semiconductor chips are stacked such that each semiconductor chip is shifted from an adjacent semiconductor chip of the plurality of semiconductor chips by a first predetermined interval in the aligning direction and shifted from the adjacent semiconductor chip by a second predetermined interval in a second direction orthogonal to both the first direction and the aligning direction, and
the plurality of conductive pads of each semiconductor chip are spaced such that the conductive pads do not overlap conductive pads of the adjacent semiconductor chip of the plurality of semiconductor chips in the aligning direction; and
a plurality of electric wirings electrically connecting the plurality of conductive pads of every other semiconductor chip of the plurality of semiconductor chips, respectively, wherein
each electric wiring of the plurality of electric wiring linearly extends in the second direction, wherein
in each of the semiconductor chips, the plurality of conductive pads include a first plurality of power conductive pads for power supply and a signal communication conductive pad for signal communication, and
the signal communication conductive pad for signal communication is interposed between the first plurality of power conductive pads for power supply in the aligning direction of the conductive pads, both conductive pads adjacent to the signal communication conductive pad for signal communication being power conductive pads of the first plurality of power conductive pads for power supply.

2. The semiconductor device according to claim 1, wherein the plurality of electric wirings extend with predetermined intervals therebetween when seen from a top of the semiconductor device.

3. The semiconductor device according to claim 1, wherein
the plurality of electric wirings include a first plurality of electric wirings for power supply which electrically connect the first plurality of power conductive pads for power supply of every other semiconductor chip of the plurality of semiconductor chips, respectively, and a second electric wiring for signal communication which electrically connects the signal communication conductive pad for signal communication of every other semiconductor chip of the plurality of semiconductor chips, and
the second electric wiring for signal communication is interposed between the first plurality of electric wirings for power supply.

4. The semiconductor device according to claim 1, wherein
each of the semiconductor chips has a substantially rectangular shape with four sides, and
the plurality of conductive pads are aligned along one of the four sides in each of the semiconductor chips.

5. The semiconductor device according to claim 3, wherein the second electric wiring for signal communication connects the signal communication conductive pads for signal communication of the plurality of semiconductor chips for parallel operation.

6. The semiconductor device according to claim 4, wherein the semiconductor chips are stacked such that the plurality of conductive pads of each of the semiconductor chips are exposed at one, two or four of the four sides when viewed from the top of the semiconductor device.

7. The semiconductor device according to claim 4, wherein the semiconductor chips are stacked such that the plurality of conductive pads of each of the semiconductor chips are exposed at a plurality sides of the four sides when viewed from the top of the semiconductor device.

8. A semiconductor device, comprising:
a first semiconductor chip including a first plurality of conductive pads spaced along a first axis;
a second semiconductor chip stacked above the first semiconductor chip along a second axis orthogonal to the first axis, the second semiconductor chip including a second plurality of conductive pads spaced along the first axis, the second semiconductor chip shifted from the first semiconductor chip by a first predetermined interval along a third axis orthogonal to the first axis and the second axis and the second semiconductor chip shifted from the first semiconductor chip by a second predetermined interval along the first axis;
a third semiconductor chip stacked above the second semiconductor chip along the second axis, shifted from the second semiconductor chip by the first predetermined interval along the third axis and shifted from the second semiconductor chip by a second predetermined intelval along the first axis so that the third semiconductor chip is aligned with the first semiconductor chip along the first axis, the third semiconductor chip including a third plurality of conductive pads spaced along the first axis; and
a plurality of electric wirings, wherein
each electric wiring electrically connects a respective conductive pad of the first plurality of conductive pads to a respective conductive pad of the third plurality of conductive pads, wherein the first plurality of conductive pads include a plurality of power conductive pads for power supply and a signal communication conductive pad for signal communication, and
the signal communication conductive pad is interposed between power conductive pads of the plurality of power conductive pads along the first axis, both conductive pads adjacent to the signal communication conductive pad for signal communication being power conductive pads of the first plurality of power conductive pads for power supply.

9. The semiconductor device according to claim 8, wherein the conductive pads of the first plurality of conductive pads, the second plurality of conductive pads; and the third plurality of conductive pads are spaced at intervals such that the conductive pads do not overlap along the first axis.

10. The semiconductor device according to claim 8, wherein each of the first, second and third semiconductor chips has a substantially rectangular shape.

11. The semiconductor device according to claim 8, wherein the third semiconductor chip is shifted from the second semiconductor chip by the first predetermined interval along the third axis so that the third semiconductor chip is aligned with the first semiconductor chip along the third axis.

12. The semiconductor device according to claim 8, wherein the third semiconductor chip is shifted from the second semiconductor chip by the first predetermined interval along the third axis so that the third semiconductor chip is not aligned with the first semiconductor chip along the third axis.

13. The semiconductor device according to claim 8, wherein each electric wiring of the plurality of electric wirings extends a predetermined distance between connecting conductive pads.

14. The semiconductor device according to claim 8, wherein
the third plurality of conductive pads includes a second plurality of power conductive pads for power supply and a second signal communication conductive pad for signal communication, and
the second signal communication conductive pad is interposed between second power conductive pads of the second plurality of power conductive pads along the first axis.

15. The semiconductor device according to claim 14, wherein
the signal communication conductive pads connected to the second signal communication conductive pad by an electric wiring for parallel operation between the first semiconductor chip and the third semiconductor chip.

16. A flash memory device, comprising:
a first flash memory chip including a first plurality of conductive pads spaced along a first axis;
a second flash memory chip stacked above the first flash memory chip along a second axis orthogonal to the first axis, the second flash memory chip including a second plurality of conductive pads spaced along the first axis, the second flash memory chip shifted from the first flash memory chip by a first predetermined interval along a third axis orthogonal to the first axis and the second axis and the second flash memory chip shifted from the first flash memory chip by a second predetermined interval along the first axis;
 a third flash memory chip stacked above the second flash memory chip along the second axis, shifted from the second flash memory chip by the first predetermined interval along the third axis and shifted from the second flash memory chip by a second predetermined interval along the first axis so that the third flash memory chip is aligned with the first flash memory chip along the first axis, the third flash memory chip including a third plurality of conductive pads spaced along the first axis; and
 a plurality of electric wirings, wherein
 each electric wiring electrically connects a respective conductive pad of the first plurality of conductive pads to a respective conductive pad of the third plurality of conductive pads, wherein
 the first plurality of conductive pads include a plurality of power conductive pads for power supply and a signal communication conductive pad for signal communication, and
 the signal communication conductive pad is interposed between power conductive pads of the plurality of power conductive pads along the first axis, both conductive pads adjacent to the signal communication conductive pad for signal communication being power conductive pads of the first plurality of power conductive pads for power supply.

17. The flash memory device according to claim 16, wherein the conductive pads of the first plurality of conductive pads, the second plurality of conductive pads and the third plurality of conductive pads are spaced at intervals such that the conductive pads do not overlap along the first axis.

18. The flash memory device according to claim 16, wherein
 the first plurality of conductive pads includes a plurality of power conductive pads for power supply and a signal communication conductive pad for signal communication,
 the signal communication conductive pad is interposed between power conductive pads of the plurality of power conductive pads along the first axis, and
 the third plurality of conductive pads includes a second plurality of power conductive pads for power supply and a second signal communication conductive pad for signal communication,
 the second signal communication conductive pad is interposed between second power conductive pads of the second plurality of power conductive pads along the first axis, and
 the signal communication conductive pad is connected to the second signal communication conductive pad by an electric wiring for parallel operation between the first flash memory drip and the third flash memory chip.

\* \* \* \* \*